March 4, 1969 R. R. HABERECHT 3,431,350

CIRCUIT BOARD

Filed March 31, 1966 Sheet 1 of 3

ROLF REINHOLD HABERECHT
INVENTOR

BY John D. Graham

ATTORNEY

United States Patent Office 3,431,350

Patented Mar. 4, 1969

3,431,350
CIRCUIT BOARD

Rolf Reinhold Haberecht, Richardson, Tex., assignor to Texas Instruments Incorporated, Dallas, Tex., a corporation of Delaware Filed Mar. 31, 1966, Ser. No. 539,034
U.S. Cl. 174—68.5 5 Claims
Int. Cl. H05k *1/00, 3/00, 3/20*

ABSTRACT OF THE DISCLOSURE

This specification discloses a circuit board amenable to multilayer fabrication and characterized by a sheet of electrical insulation having a plurality of holes therein, a circuit pattern of electrically conductive foil bonded to one face of the sheet and having integral portions cupped through at least some of the holes substantially to the other face of the sheet and closing the respectives holes, and insulated conductors having bared portions connected to the cupped integral portions of the pattern. In other embodiments an electrically insulating and bedding material is employed to cover the other face of the sheet and the conductors. The specification describes the method of preparing the circuit board also. The circuit board is particularly useful where a high density of electronic components is desired.

This invention relates to circuit boards which permit high-density arrangements on the boards of electronic circuit components such as semiconductor networks or the like, and to methods for manufacturing such circuit boards.

Among the several objects of the invention may be noted the provision of an inexpensively manufactured circuit board in which wire connections are thoroughly insulated and which is capable of receiving and interconnecting semiconductor networks (so-called SCN's) or like electronic components in high-density arrangements; the provision manufactured circuit board in which circuit interconnections can be rapidly formed manually or automatically as by computer control by use of either continuous or segmented wire interconnection techniques; the provision of a circuit board for high-density arrangement of electronic circuit components which eliminates the need for delaminating the board from a carrier as required by a prior process; the provision of such a circuit board which can conveniently be pretested and corrected if necessary for proper wire interconnections before completion; and the provision of a circuit board on which the electronic components can be easily mounted or replaced. Other objects and features will be in part apparent and in part pointed out hereinafter.

The invention accordingly comprises the products hereinafter described, the scope of the invention being indicated in the following claims.

In the accompanying drawings, in which several of various possible embodiments of the invention are illustrated, FIGURE 1 is a sectional view illustrating an initial panel-forming step in the manufacture of a circuit board;

Corresponding reference characters indicate corresponding parts throughout the several views of the drawings. In view of the thinness of certain layers, their dimensions have been exaggerated and are not to scale.

Figure 1:
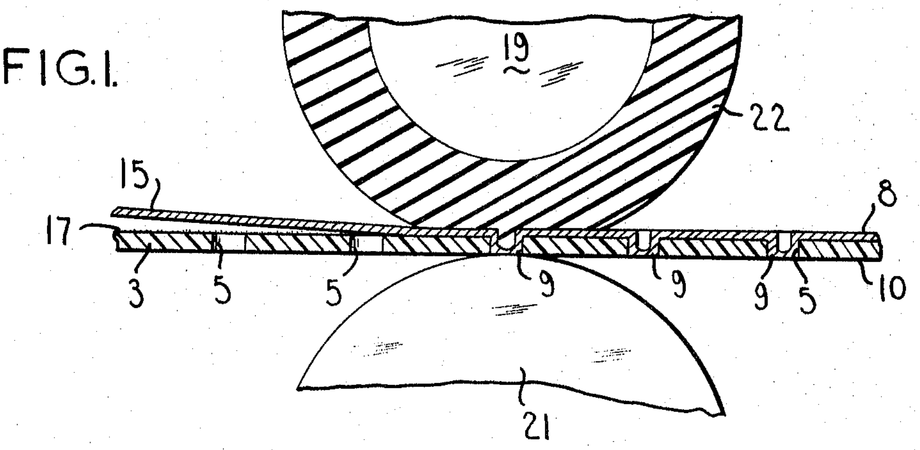

Briefly, a method of making circuit boards according to the invention utilizes in part the techniques described in copending application Ser. No. 518,053, filed Jan. 3, 1966, now abandoned, by Carl M. Skooglund, Jr., and assigned to the assignee of the present invention. The method of this invention comprises forming a panel 1 (FIGURE 2) comprising a sheet or layer 3 of electrical insulation having a plurality of holes 5 located in it. A circuit pattern 7 is formed on one face 8 of the panel by means to be described. Pattern 7 is formed from an electrically conductive metal foil having integral conduction paths, as by bosses 9 (FIGURE 4) projecting through some of the holes in the sheet of insulation and extending to the other face 10 of the sheet. Certain of the bosses are interconnected by electrical conductors 11 in the form of wires. At this stage, inspection for adequate circuit connetions can easily be made. If desired, a wire embedding layer of insulating material 13 (FIGURE 5) is thereafter secured to face 10 of panel 1 to provide mechanical support for the wires and/or insulation from the environment, although this embedding layer is not always necessary. Finally, semiconductor networks or other electronic devices are attached.

More specifically, sheet 3 is constituted by a conventional insulating board material such as fiber glass impregnated with epoxy resin, for example. As shown in FIGURE 1, the sheet 3 is perforated to form a pattern of holes 5 therein. These holes are usually in a regular pattern throughout the area of sheet 3 but may be in an irregular pattern if desired.

The circuit pattern is formed from a thin layer of malleable electrically conductive metal foil 15 (FIGURE 1). The metal layer 15 may be any suitable conductive material, such as copper, nickel, or a composite of different metals. Foil 15 is secured to one face of the sheet 3 by applying a suitable adhesive 17 between the two layers 3 and 15 and then passing them between compression rolls 19 and 21. In some cases, the adhesive may not be needed, such as if self bonding insulating material is used. Upper roll 19 is provided with a thick resilient and compressible facing 22 composed of rubber, neoprene, or the like. As sheet 3 and metal layer 15 pass between the rolls, pressure is applied to the rolls to compress the facing 22 and force it to bulge into the holes 5 in sheet 3. This forces cup-shaped portions of the metal foil 15 into holes 5, the bottoms of such shapes lying more or less flush with the other face of sheet 3. This occurs without rupturing the metal layer. The projecting portions of the metal layer form the bosses 9. Roll 21 is made of a hard incompressible substance so that the ends of the bosses 9 in the holes 5 are flush with the face 10. If it is desired to form the bosses so that they project beneath the lower surface of sheet 3, then suitable recesses (not shown) can be provided in the surface of roll 21 and registered with the holes 5 to permit the bosses 9 to project from the sheet. This operation is, in effect, an embossing operation on the metal layers 15 at each of the holes 5, the embosses portions of the sheet constituting the bosses 9.

Although the method for making the boards is described above ni terms of roll-bonding, other method's may be used, such as by employing preformed metal foil having solid bosses, by using flame spraying or conductive paints, etc., as described in said copending application.

The two-layer panel material produced by this operation is then segmented to form individual panels 1 of the desired size and shape, after which the circuit pattern 7 thereon is formed. This may be accomplished by etching techniques involving application of photoresist material to the upper surface of the metal layer 15, or to both the upper surface and back of the substrate, selective exposure of the photoresist, rinsing away of unexposed photoresist and then etching away of unwanted portions of the metal. The resulting circuit pattern shown for illustration in FIGURE 2 comprises a plurality of metal bars 23 arranged in pairs of rows consisting of adjacent sets of five bars in each longitudinal row. Adjacent sets of bars in a row are shown spaced from each other, thus leaving an exposed hole 5 there between. The pattern shown in FIGURE 2 is particularly suitable for mounting semiconductor networks on the circuit board, as explained more fully below.

Figures 2, 3:
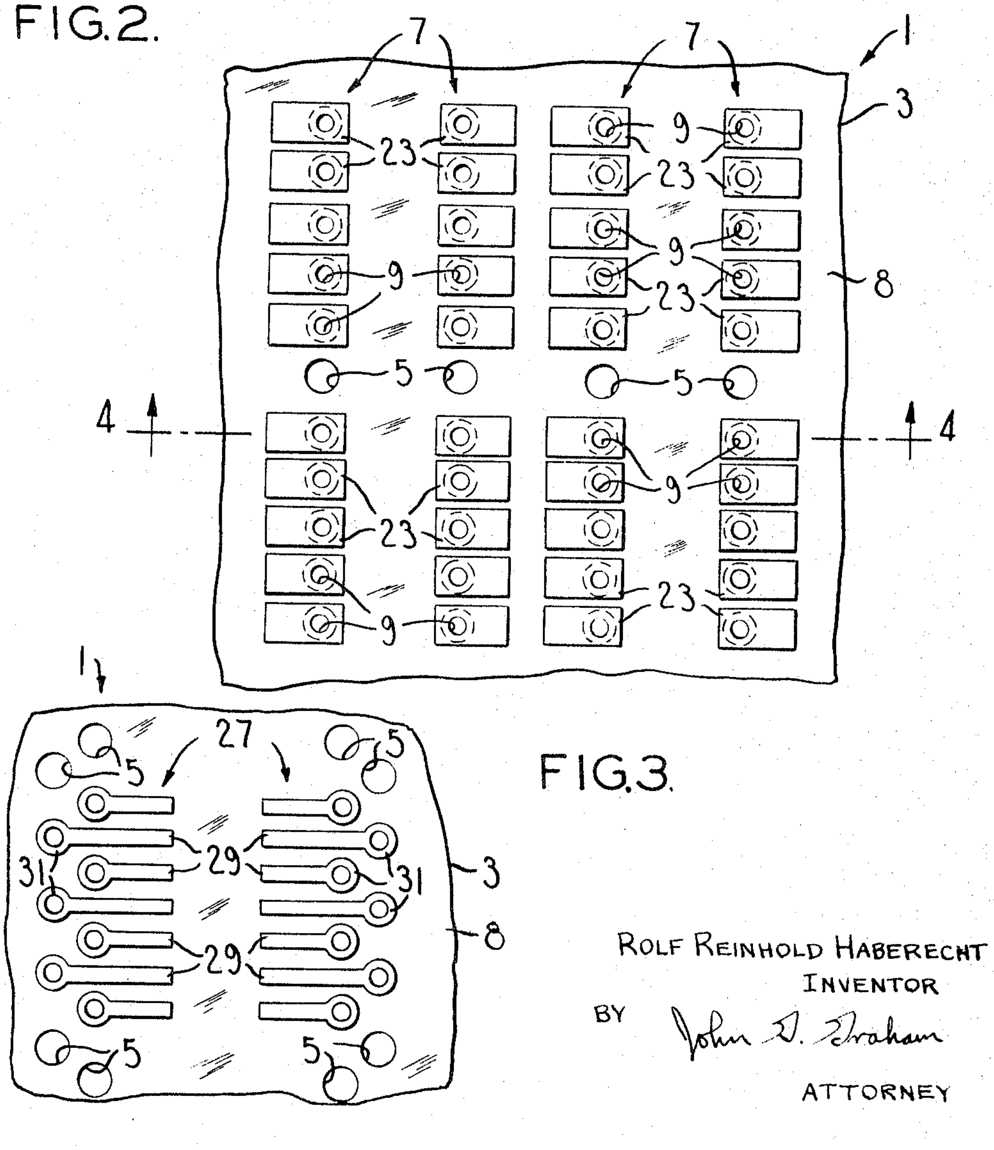
FIGURE 2 is a plan view of a typical portion of a panel after another step in the manufacture of the circuit board according to one pattern.
FIGURE 3 is a fragmentary view similar to FIGURE 2 showing a modified circuit pattern.
Figure 8:
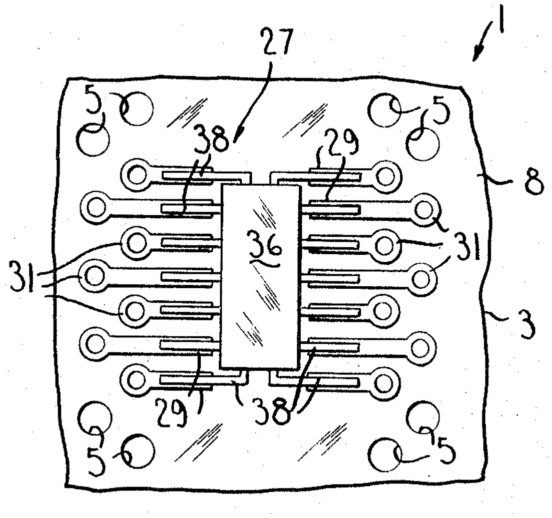
FIGURE 8 is a plan view like FIGURE 3 but showing other attached SCN electronic components.

FIGURE 3 of the drawings shows a circuit pattern having a staggered arrangement in two rows of conductors permitting high-density connections, with semiconductor networks. The FIGURE 3 pattern is designated 27 and comprises a plurality of conductive metal strips 29 terminated by enlarged circular ends 31 located around and in holes 5 in sheet 3. The pattern 27 forms two rows with the strips 29 of one row projecting toward similar strips of the other row. The two rows are separated from each other a distance sufficient to positon conventional semiconductor networks on the upper surface of sheet 3 between the bars (FIGURE 8). The holes 5 in the sheet 3 are arranged in staggered rows. With this arrangement, approximately fourteen conductor leads from an SCN can be connected to the circuit board in very little surface area. Other circuit pattern arrangements can be provided, depending upon the intended use of the board.

Figure 4:
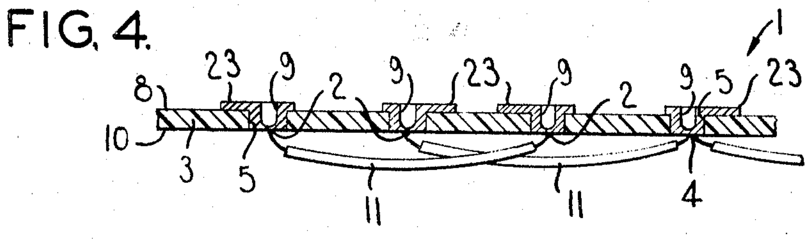
FIGURES 4 and 5 are fragmentary sections illustrating other steps in the manufacture of a circuit board, FIGURE 4 being taken on line 4—4 of FIGURE 2.
Figure 5:
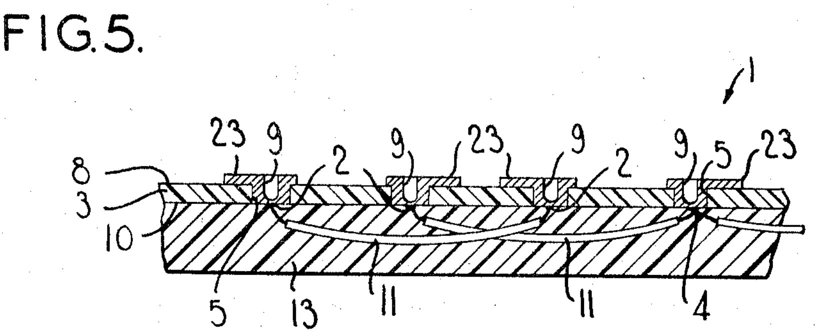
Figure 6:
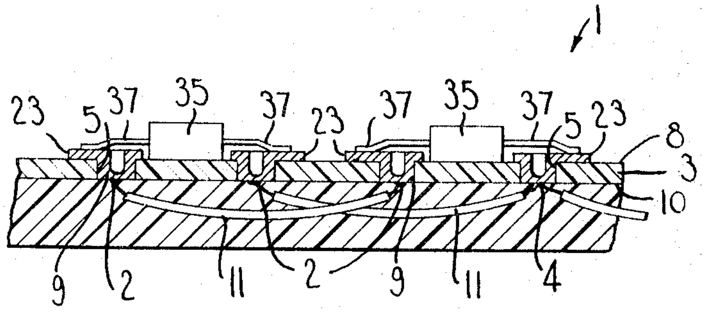
FIGURE 6 is a fragmentary section of a portion of a completed circuit board with SCN electronic components mounted thereon.

After the desired circuit pattern is formed, the conductors 11 are secured to the bosses 9. Conductors 11 are preferably in the form of wires or ribbons insulated with a material which can be easily removed or stripped away for baring an end of the wire, or an insulated wire which can be soldered or welded to without the previous removal of the insulation, such as polyurethane coated Durmet wire. The terms wires, ribbons, and the like are to be considered herein as synonymous. The conductors are welded, soldered or otherwise secured to the ends of bosses 9 at the lower face 10 of the sheet. It is very important to note that a computer-controlled continuous wire welding interconnecting operation can be used for interconnecting certain of the bosses to form the desired circuit connections. After the conductors have been secured in place, the circuit can be visually inspected for weld integrity, proper layout, and electrically tested before components are attached to the board, thus effecting savings in finishing costs should errors appear. As shown in FIGURES 4–6 a length of wire may terminate at a welded connection with a boss as shown at 2 or continue as shown at 4 to form a succeeding connection with another boss.

Material 13, known in the art, can be then molded onto the lower surface 10 of sheet 3 to form an encapsulating base for the circuit board (FIGURE 5). Material 13 is preferably a moldable electrically insulating material curable to a solid (such as plastic material and including fiber glass or the like, infilled with epoxy resin) which is applied to the sheet in the uncured condition and cured to the solid state while in this position to bond to the sheet. During this step the wires 11 become embedded in the insulating material 13 which forms a solid insulat- is preferably a moldable electrically insulating material 13 may be applied while the sheet 3 is in a suitable mold (not shown). Material 13 can be molded to a thickness slightly greater than the desired final thickness and then belt-sanded or otherwise reduced to a final thickness, but preferably it is molded to substantially the final thickness.

As mentioned above, the material 13 is not necessary. In many applications no epoxy is required, providing the advantage that the board is cheaper and is repairable at any time.

Figure 7:
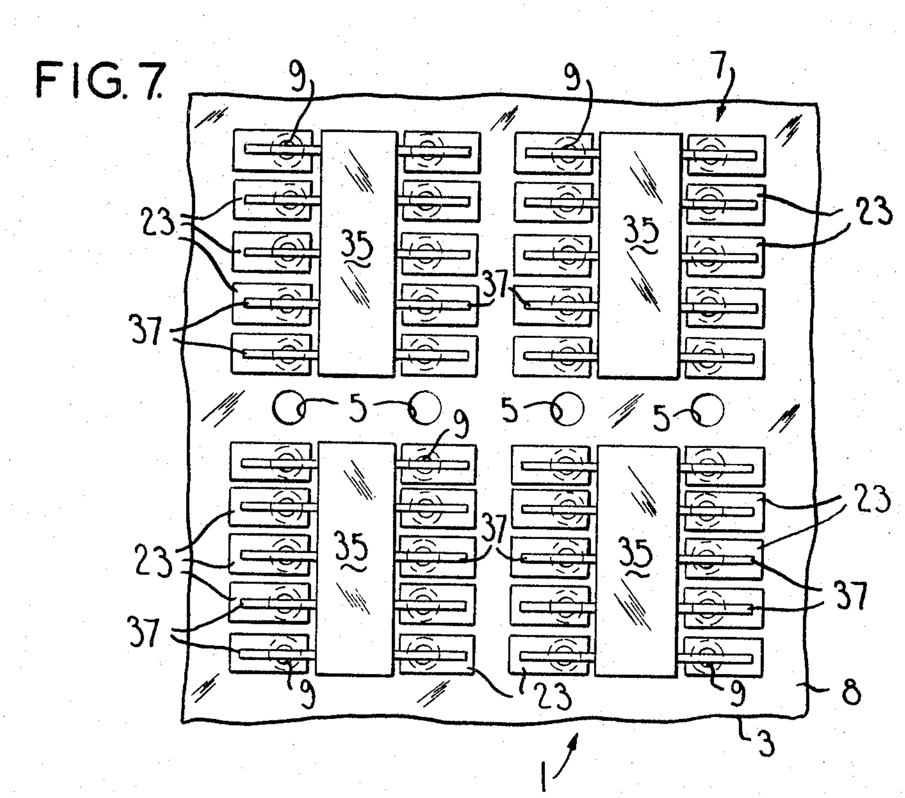
FIGURE 7 is a plan view like FIGURE 2 but showing the SCN electronic components as in FIGURE 6.

A fragment of the finished circuit board is illustrated in FIGURE 5 and comprises sheet 3 having the holes 5, part of which contain the bosses 9, at least some of the bosses being interconnected as shown by the insulated conductors 11 embedded in the embedding material 13. Finally, semiconductor networks 35 (FIGURE 6) or other electronic components are positioned on the bars such as 23 or 29 and their leads 37 welded, soldered or otherwise secured thereto. In FIGURE 6 the bars 23 are illustrated. Thus the electrical circuits of the semiconductor networks are completed or interconnected by conductors 11 embedded in the plastic base portion 13 of the circuit board before the semiconductor networks are attached. FIGURE 7 illustrates the appearance of the top of the board of FIGURE 2 after connection of the semiconductor networks 35. Each of the semiconductor networks carries ten leads. As above explained, FIGURE 8 shows the appearance of the top of the board of FIGURE 3 after connection of semiconductor networks which are lettered 36 and each of which carries fourteen leads 38.

While FIGURES 4–6 have been described in connection with the circuit pattern arrangement shown in FIGURE 2 of the drawings, it will be understood that similar steps are used in manufacturing a circuit board according to the pattern of FIGURE 3, or other patterns having different shapes.

The circuit boards of the invention do not require stacking of a plurality of individual panels for interconnecting parts of the circuit pattern, nor do they require delimination of the panel or board from a carrier, as required by some prior processes. Elimination of these steps reduces the time and material required during manufacture, thereby making circuit boards produced by the process of this invention relatively inexpensive. At the same time, the conductive pattern formed on the board surface is arranged so that semiconductor networks may be mounted on the board in a high-density arrangement, thereby providing maximum circuitry for a given surface area of the board. Because the circuit board can be tested after conductors 11 have been fixed to the bosses 9 but before formation of layer 13 as a permanent solid matrix, if the material 13 is used, manufacturing errors may be corrected before the board is completed.

In the event repairs are required due to loss of contact between the conductor 11 and a boss 9, such repairs can be easily made by removing, replacing or rerouting the conductors.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A circuit board comprising a sheet of electrical insulation having a plurality of holes therein, a circuit pattern of electrically conductive foil bonded to one face of the sheet and having integral portions cupped through at least some of the holes substantially to the other face of the sheet and closing the respective holes, and insulated conductors having bared portions connected to said cupped integral portions of said pattern.

2. A circuit board comprising
a sheet of insulating material and a circuit pattern of conductive foil on one face of the sheet, the sheet having a plurality of holes therethrough from its said one face to its other face, integral portions of the foil projecting substantially through holes in the sheet,
an electrically insulating embedding material covering said other face of the sheet,
and insulated conductors embedded in the insulating embedding material and have portions secured to said projecting portions of said pattern at said other face of the sheet to provide a conductive path between portions of the pattern.

3. A circuit board according to claim 2 wherein the circuit pattern further comprises strip portions extending away from said holes along said one face of the sheet, the strip portions being generally parallel to each other.

4. A circuit board according to claim 3 wherein the strip portions of the pattern are arranged in pairs of rows with each row containing a plurality of the strip portions positioned in closely spaced relation for contact with leads of semiconductor networks.

5. A circuit board according to claim 4, wherein the strip portions are terminated by enlarged portions from which said integral portions of the foil extend through the holes, said holes being arranged in staggered rows and certain alternate strip portions in a row of strip portions being comparatively long and short.

No references cited.

DARRELL L. CLAY, *Primary Examiner*.

U.S. Cl. X.R.

317—101; 29—625; 339—17